United States Patent
Higuchi et al.

(10) Patent No.: US 7,439,801 B2
(45) Date of Patent: Oct. 21, 2008

(54) AMPLIFIER CIRCUIT WITH MULTIPLE POWER SUPPLIES

(75) Inventors: Yasuo Higuchi, Singapore (SG); Shiah Siew Wong, Singapore (SG)

(73) Assignees: Matsushita Electric Industrial Co., Ltd., Osaka (JP); Panasonic Semiconductor Asia Pte. Ltd., Singapore (SG)

( * ) Notice: Subject to any disclaimer, the term of this patent is extended or adjusted under 35 U.S.C. 154(b) by 75 days.

(21) Appl. No.: 11/536,221

(22) Filed: Sep. 28, 2006

(65) Prior Publication Data

US 2008/0079486 A1    Apr. 3, 2008

(51) Int. Cl.
H03F 3/38    (2006.01)

(52) U.S. Cl. .................................... 330/10; 330/251

(58) Field of Classification Search ............... 330/10, 330/251, 207 A
See application file for complete search history.

(56) References Cited

U.S. PATENT DOCUMENTS

| 6,448,851 B1 | 9/2002 | McIntosh et al. |
| 7,076,070 B2 * | 7/2006 | Pearce et al. ............... 381/120 |

* cited by examiner

Primary Examiner—Robert Pascal
Assistant Examiner—Hieu P Nguyen
(74) Attorney, Agent, or Firm—Greenblum & Bernstein, P.L.C.

(57) ABSTRACT

An amplifier circuit that uses multiple power supplies includes a class D amplifier circuit, input bias generator and feedback network. By creating a voltage using the input bias generator at the non inverting terminal of the integrator, the inverting terminal of the integrator will follow the same voltage as the non inverting terminal. The offset voltage between the input signal DC bias and the input DC bias of the integrator will create an offset current flowing through the feedback resistors, thus resulting in the desired output DC bias.

6 Claims, 6 Drawing Sheets

AMPLIFIER CIRCUIT WITH MULTIPLE POWER SUPPLIES

FIELD OF THE INVENTION

The present invention relates to an amplifier circuit having multiple power supplies and, more particularly, to a class D amplifier circuit.

BACKGROUND OF THE INVENTION

In an integrated amplifier circuit, multiple power supplies are used to bias different circuit blocks of the amplifier circuit. In order to maximize power efficiency and output dynamic range, the output stage of the amplifier circuit is biased with a power supply that is different from the rest of the circuit. The output stage of the amplifier circuit can be of a class D or class AB output stage The DC voltage at the output of the amplifier circuit is normally biased at the mid point of the power rails.

For an amplifier circuit, the signal is feedback from the output to the input of the amplifier circuit. This feedback is for the purpose of having a fixed gain and better THD (Total Harmonic Distortion) performance. The input of the amplifier circuit is normally biased at the mid point of the power rails supplying the input stage of the amplifier circuit. However, the DC level of the output stage is different from the DC level of the input stage. As a result, the DC bias at the inverting and non inverting terminals of the input stage of the amplifier circuit will be at a different level. This may result in a large DC offset at the output of the amplifier circuit and a reduced output dynamic range of the output stage.

FIG. 1 is a block diagram showing a conventional class D PWM amplifier circuit 24. Here the output stage comprises of NMOS power transistors 1 and 2 for illustration only. The transistors could be a bipolar or P/N-type DMOS complementing transistor. The output signal is feedback from the output to the negative terminal of the integrator 6 using resistor 3. Here resistor 3 is for illustration only. The feedback circuit may comprise of a network of transistors and resistors and capacitors. The positive terminal of integrator 6 is biased with HVCC (Mid point of the Output Power Rail).

One problem of this conventional circuit is that HVCC may be too high or too low to be used as input bias. This will result in a decrease in the input dynamic range. It will be even worse if the output power supply is several times the magnitude of the integrator power supply. HVCC may be out of the input dynamic range for the integrator 6.

SUMMARY OF THE INVENTION

The purpose of this invention is to provide an amplifier circuit so arranged to bias the output without reducing the output dynamic range or input dynamic range in a multiple power supplies setup.

According to the present invention, a class D amplifier circuit that uses multiple power supplies is incorporated with a resistor network to determine the input voltage bias so as to maintain a desired output voltage.

For a class D amplifier circuit, if the input and output DC bias voltages are different, an offset current will flow through the feedback resistor. Amplitude of the offset current is determined by the offset voltage between input and output, as well as the feedback resistor value. The final value of the output DC bias will be the input DC bias and the DC offset voltage added together.

In order to ensure that the output bias is at optimal value for the class D amplifier circuit, an input bias generator is incorporated with the class D amplifier circuit. The purpose of the input bias generator is to provide an input bias for the integrator which will result in a desired output bias for the amplifier circuit. The input bias generator will have the input DC bias and the desired output DC bias as voltage references. Making use of the same feedback circuit used by the PWM class D amplifier circuit, the input bias generator will produce the desired DC bias at the input of the integrator stage. As a result, the output bias will also be at the desired level that is determined by design.

According to the present invention, an amplifier circuit, having multiple power supply sources, being arranged to bias the output comprises: means for applying the DC input bias and the desired output bias at the two ends of the resistor network. The output of the resistor network is applied at the non inverting terminal of the integrator.

According to the present invention, the resistor values or resistance ratio of the resistor network are identical or close to the resistor network used for the feedback network.

According to the present invention, the DC input bias and the desired output bias are applied to the resistor network in the same order as the input and output applied to the feedback network.

According to the present invention, the DC bias at the non inverting terminal of the integrator will force the DC bias at the inverting terminal of the integrator to be similar.

According to the present invention, a DC offset will be created between the input signal DC bias and the integrator input DC bias.

According to the present invention, the DC offset will create a DC offset current to flow from the output of the amplifier circuit to the input of the amplifier circuit, creating a DC offset between the output DC bias and input DC bias.

According to the present invention, the output DC bias of the amplifier circuit is equal to the DC offset created by the DC offset current flowing through the resistive feedback added to the input DC bias.

DETAILED DESCRIPTION OF THE PREFERRED EMBODIMENTS

The following description explains the best mode of embodiment of the present invention. A PWM class D amplifier circuit according to an embodiment of the present invention will be described with reference to FIG. 2.

Figure 1:
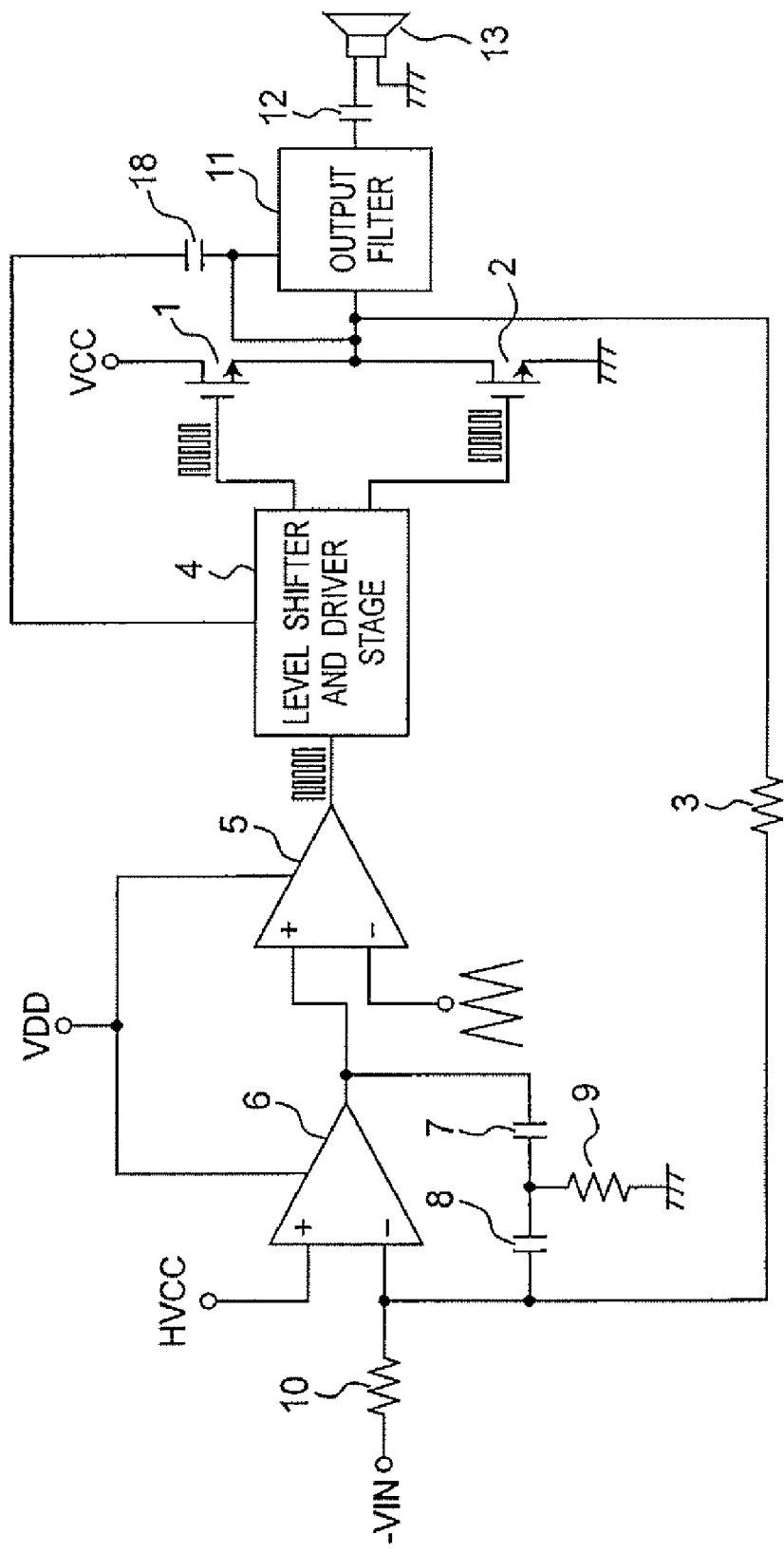
FIG. 1 is a block diagram showing the class D amplifier circuit according to the prior art.
Figure 2:
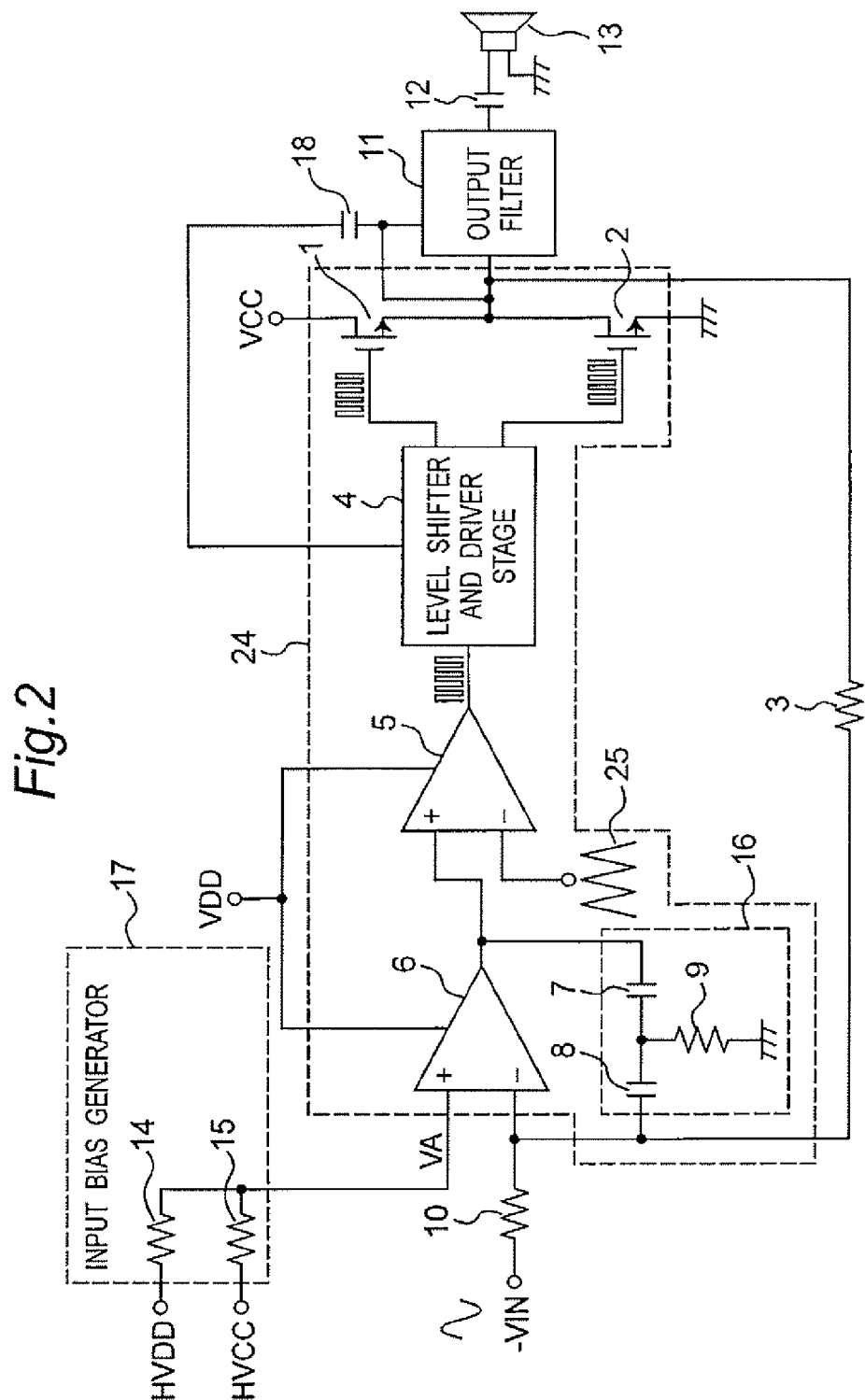
FIG. 2 is a block diagram showing the class D amplifier circuit according to the first embodiment.

FIG. 2 shows a block diagram of a PWM class D amplifier circuit according to an embodiment of the present invention.

Figure 4:
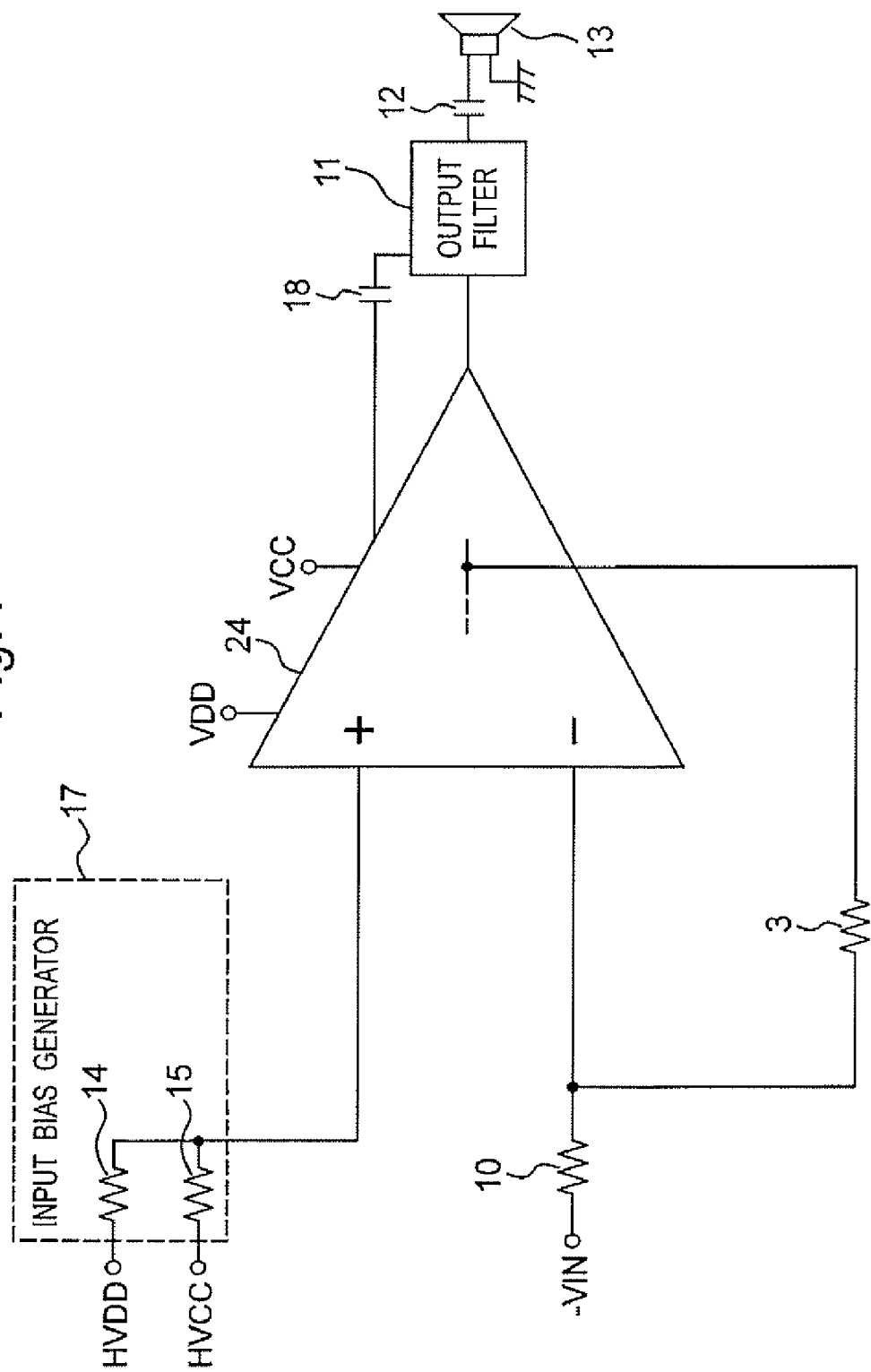
FIG. 4 is a simplified block diagram showing the class D amplifier.

The PWM class D amplifier circuit, represented by an equivalent Amplifier Circuit Block 24 (see FIGS. 2 and 4) comprises an integrator 6, a comparator 5, a ramp carrier signal 25, a level shifter and driver stage 4 and two NMOS power transistors 1 and 2. The PWM signals are depicted at outputs of comparator 5 and the level shifter and driver stage 4. The transistors 1 and 2 are connected in series between a power supply VCC and a ground. The output is connected to a bootstrap capacitor 18 and an output filter 11. The filter 16 of the integrator 6 can be of any order. The output filter 11 can be of any order. The integrator 6, comparator 5 and ramp carrier signal producer 25 define a modulation circuit. The non-inverting and inverting inputs of the integrator 6 serve also as the non-inverting and inverting inputs of the PWM class D amplifier circuit 24. The integrator 6 also has a terminal for receiving a power supply VDD.

Figure 3:
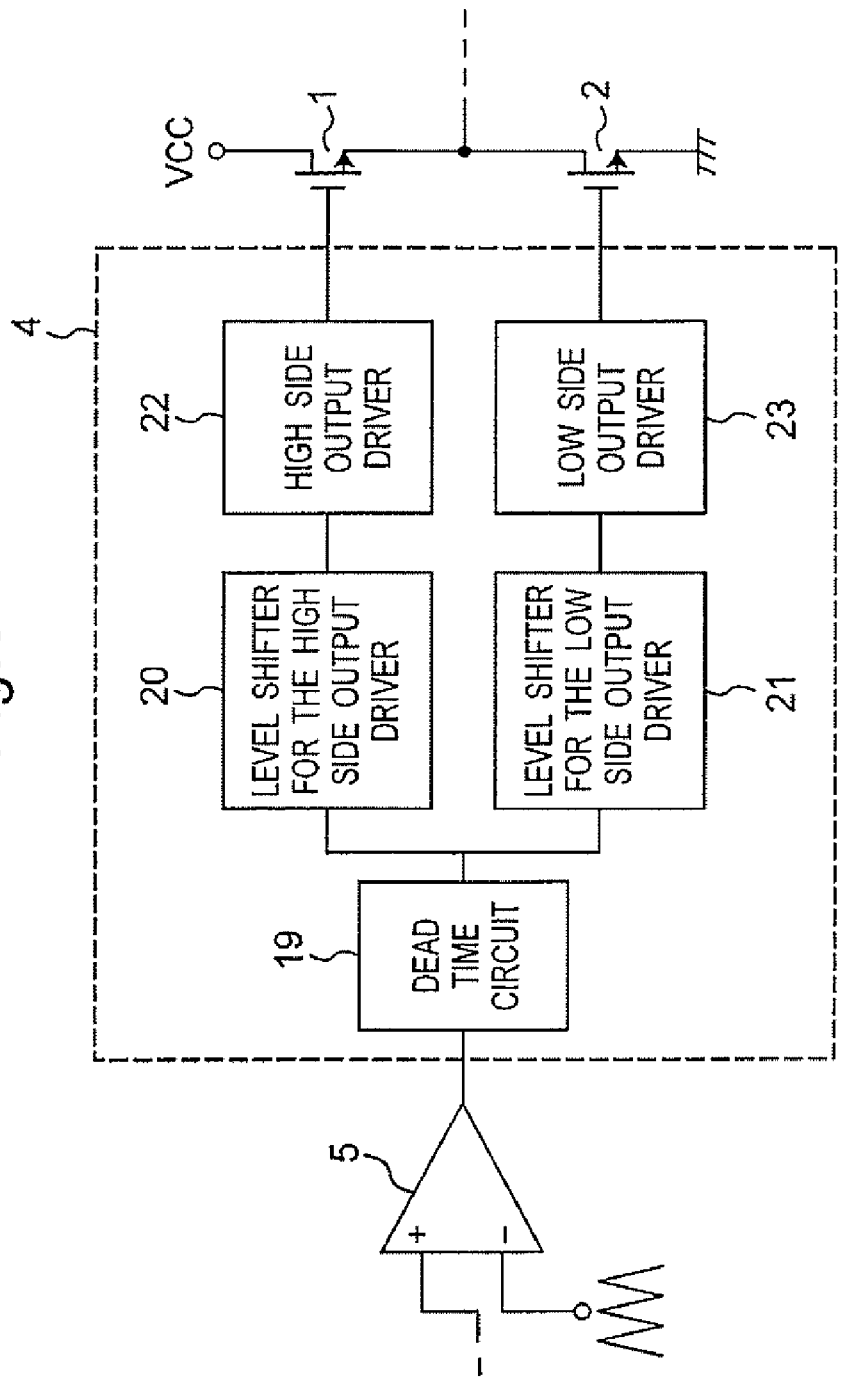
FIG. 3 shows the output stage to explain how HVCC is determined.

As shown in FIG. 3, the level shifter and driver stage 4 comprise a dead time circuit 19, a level shifter for the high side output driver 20, a level shifter for the low side output driver 21, a high side output driver 22 and a low side output driver 23.

Figure 5:
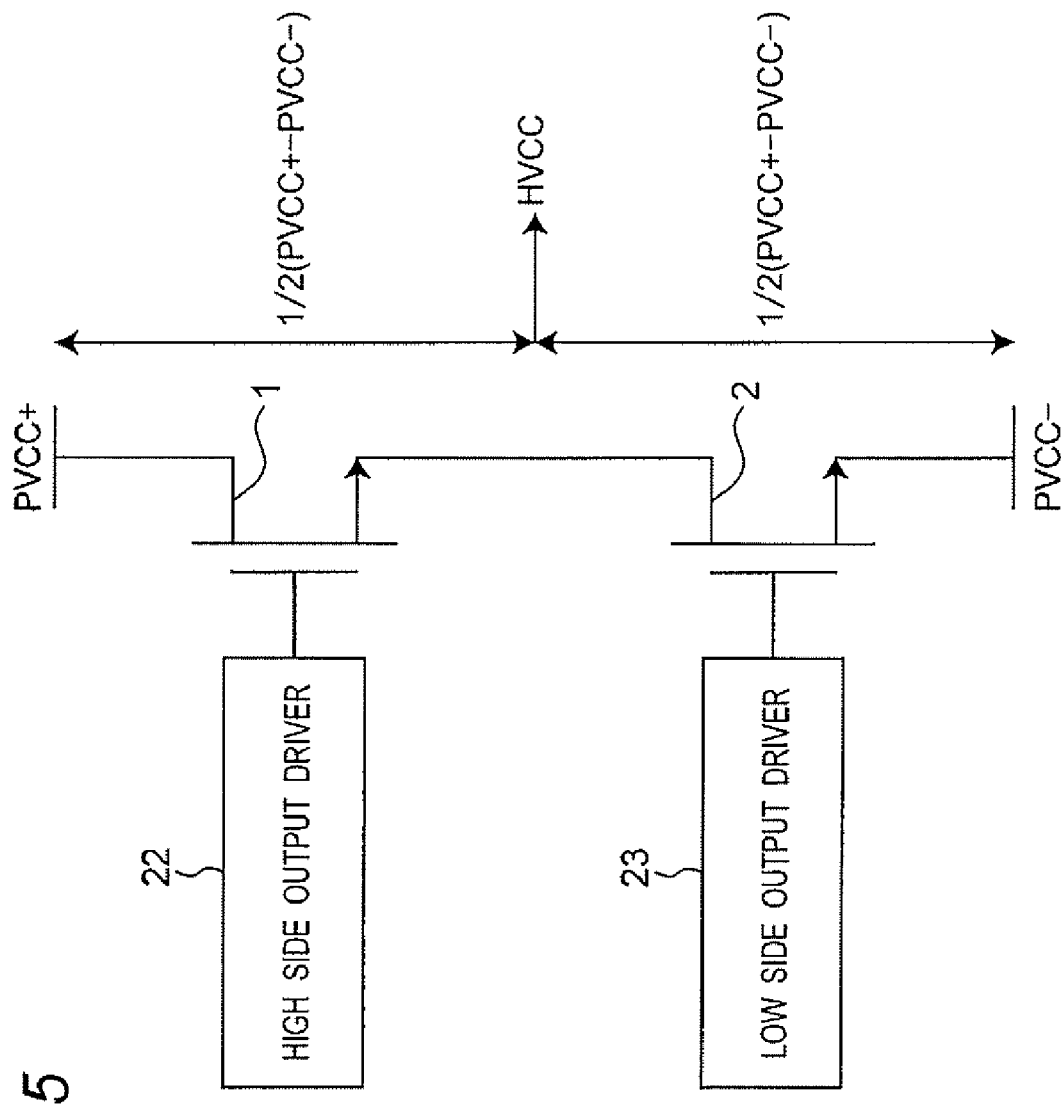
FIG. 5 is an illustration of output dc bias.

Here NMOS power transistors 1 and 2 are used, but can be any other type, such as a bipolar transistor or a P/N-type DMOS complementing transistor. Depending on the type of transistors 1, 2 used and the structure of the high side output driver 22 and the low side output driver 23, the output dynamic range is determined. Here the output dynamic range is the difference between the two power rails, VCC and ground level, as shown in FIGS. 2 and 3, showing a single power supply. Instead of the single power supply, it is possible to use a dual power supply, as shown in FIG. 5, in which a positive power supply PVCC+ is used in place of power supply VCC, and a negative power supply PVCC− is used in place of the ground. Using this information, it is possible to generate an optimum output bias which is referred to as a HVCC. In the case of FIGS. 2 and 3, $$HVCC = \tfrac{1}{2}(VCC),$$

and in the case of FIG. 5, $$HVCC = \tfrac{1}{2}(PVCC+ - PVCC-)$$

The voltage HVCC is then applied into the input bias generator 17. It is noted that the voltage HVCC is lower than the voltage VDD.

The input bias generator 17 comprises a resistor network as shown in FIG. 2, having resistors 14 and 15 connected in series. The resistor network has two input terminals and one output terminal. HVDD which is the input bias at the input of the amplifier circuit, and HVCC which is the midpoint of the output power rails are applied at the two input terminals of the resistor network 17. An output of the resistor network 17 is a junction between the resistors 14 and 15. The resistor 14 has the same resistance value as that of resistor 10 and the resistor 15 has the same resistance value as that of resistor 3. As a result, the output of the input bias generator 17 which is applied at the non inverting terminal of the integrator 6 will be similar to the input bias at the inverting terminal of the integrator 6. Hence the output bias will depend on the value of the HVCC applied at the input bias generator.

The present invention makes use of the feedback network to generate a smaller input bias while maintaining the output bias to be at HVCC. Here in FIG. 2, the feedback network comprises the resistor 10 and the resistor 3. Making use of this feedback network, it is possible to generate an input bias which is within the input dynamic range of the integrator. The input bias generator 17 does not necessarily be a resistor network. The structure of the input bias generator will depend on the feedback network. The feedback network comprises resistors 3 and 10. This is necessary for the input bias generator to maintain the same characteristics as the feedback network. This is to ensure the input bias at the non inverting terminal of the integrator 6 is able to track the input bias of the inverting terminal of the integrator 6. The output VA of the input bias generator 17 will be:

$$VA = [HVDD + (HVCC - HVDD)(R14/(R14+R15))].$$

Figure 6:
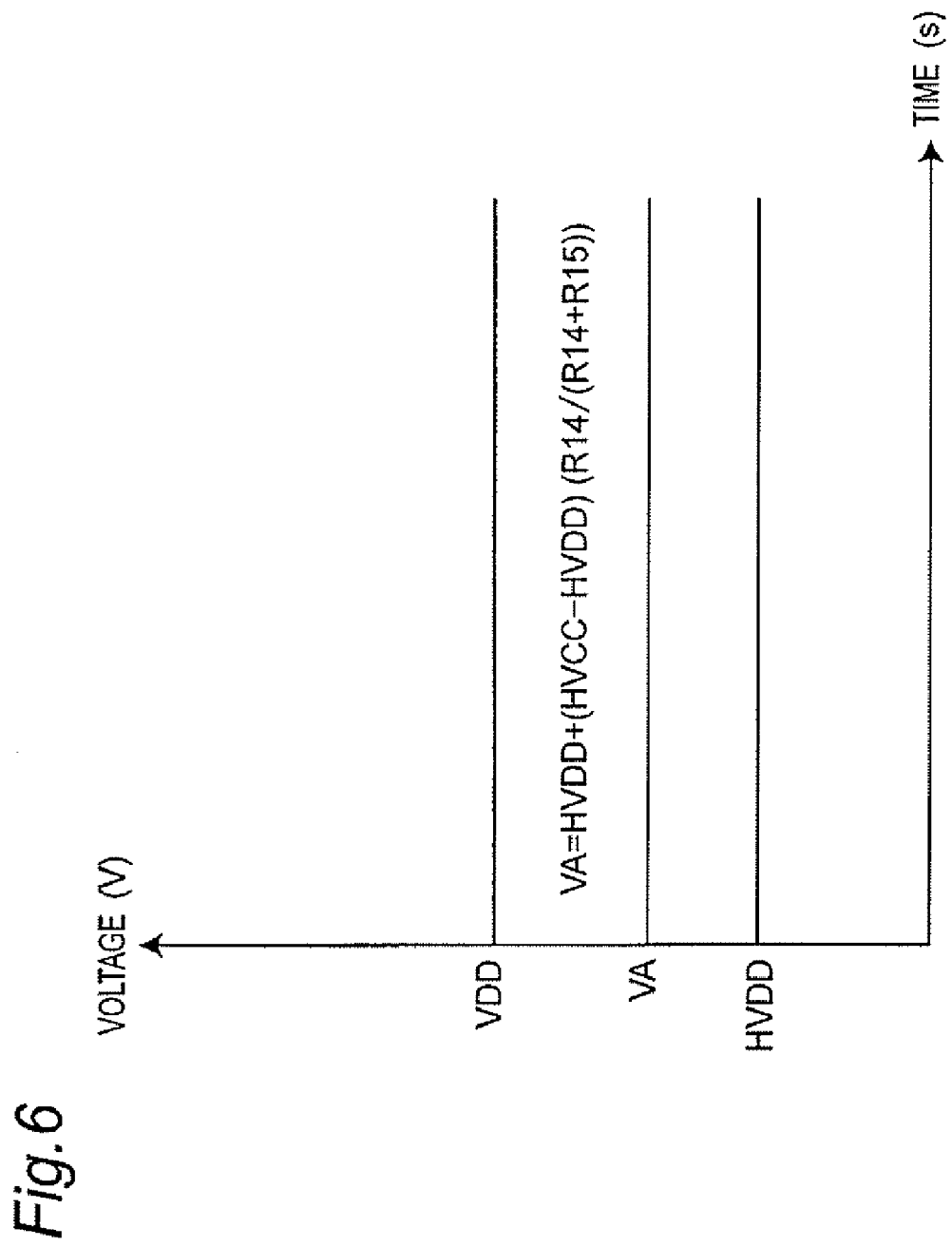
FIG. 6 is DC bias waveform at input stage.

The relationship among the voltages VDD, HVDD and VA is shown in FIG. 6. It is noted that the value VA is always smaller than VDD, regardless of the value of VCC.

The HVDD in the equation refers to the input signal DC bias.

Based on the feedback principle, the DC voltage at the non inverting terminal of the integrator 6 will force the DC voltage at the inverting terminal of the integrator 6 to be the same.

Since the DC Voltage at −VIN is equal to HVDD, therefore, the inverting input of integrator with respect to −VIN has an offset of:

$$(HVCC-HVDD)(R14/(R14+R15)).$$

With the value of the resistor 14 being identical or close to the value of resistor 10 and the value of the resistor 15 being identical or close to the value of resistor 3, the DC offset current created by the DC offset between −VIN and the Inverting Input of integrator 6 will be:

$$\{(HVCC-HVDD)(R14/(R14+R15))\}/R10.$$

Since R14=R10 & R15=R3, $$\therefore (HVCC-HVDD)/(R3+R10).$$

The output DC bias will be:

$$\{(HVCC-HVDD)/(R3+R10) \times R3\} + \{(HVCC-HVDD)/(R3+R10) \times R10\} + HVDD = HVCC$$

Hence the DC output bias will be HVCC which is the optimum value to bias the output.

As apparent from the above, the amplifier circuit of the present invention uses multiple power supplies and includes a class D amplifier circuit, input bias generator and feedback network. By creating a voltage using the input bias generator at the non inverting terminal of the integrator, the inverting terminal of the integrator will follow the same voltage as the non inverting terminal. The offset voltage between the input signal DC bias and the input DC bias of the integrator will create an offset current flowing through the feedback resistors, thus resulting in the desired output DC bias.

An advantage of the present invention is its simplicity. The implementation of this present invention does not require complex circuitry. Another advantage of the present invention is its ability to track the voltage level at the output power rails.

While the invention has been described with illustrative embodiments, the description is not intended to be interpreted in a limiting sense. Various modifications and combinations of the illustrative embodiments, as well as other embodiments of the invention, will be apparent to persons skilled in the art upon reference to the description.

What is claimed is:

1. An amplifier circuit for outputting an output signal with a predetermined DC level of HVCC comprising:

an input stage with a terminal for receiving a first power supply and two input terminals of a non-inverting terminal and an inverting terminal, said inverting terminal being connected to a feedback network;

an amplifying stage which amplifies the signal from the input stage;

an output stage connected to said amplifying stage and having a terminal for receiving a second power supply which is different from the first power supply;

a feedback network comprising a first resistor with a resistance value of R1 and which is connected between an output terminal of the output stage and the inverting terminal of the input stage and a second resistor with a resistance value of R2 which is connected between a terminal of an input signal with a DC level of HVDD and the inverting terminal of the input stage; and an input bias generator circuit outputting a DC voltage of VA to the non inverting terminal of the input stage, wherein $VA=HVDD+(HVCC-HVDD)(R2/(R1+R2))$.

2. The amplifier circuit according to claim 1, wherein said input bias generator circuit comprises third and fourth resistors connected in series between a terminal for receiving said HVDD and a terminal for receiving said HVCC, and have the same resistance ratio as the first and second resistors, respectively.

3. The amplifier circuit according to claim 2, wherein the output of said input bias generator circuit is a point of connection between said third and fourth resistors.

4. A class-D amplifier circuit for outputting an output signal with a predetermined DC level HVCC comprising:

an input stage including an integrator having a power receiving terminal for receiving a first power supply and two input terminals of a non-inverting terminal and an inverting terminal, said non-inverting terminal being connected to an input bias generator;

a modulation circuit comprising a comparator having two input terminals which are connected to the output of the integrator and a carrier signal producer;

a level shifter and driver stage comprising a dead time circuit connected to the output of said comparator, a first level shifter for a high side output driver, a second level shifter for a low side output driver, a high side output driver and a low side output driver;

an output stage connected to a second power supply;

a feedback network comprising a first resistor with a resistance value of R1 which is connected between an output terminal of the output stage and the inverting terminal of the input stage, and second resistor with a resistance value of R2 which is connected between a terminal of an input signal with a DC level of HVDD and the inverting terminal of the input stage; and an input bias generator outputting a DC voltage of VA to the non inverting terminal of the input stages, wherein $VA=HVDD+(HVCC-HVDD)(R2/(R1+R2))$.

5. The class D amplifier circuit according to claim 4, wherein said input bias generator circuit comprises a third resistor and a fourth resistor which are connected in series between a terminal for receiving said HVDD and a terminal for receiving said HVCC, said said third and fourth resistors having a same resistance ratio as said first and second resistors.

6. The class D amplifier circuit according to claim 5, wherein said input bias generator has an output terminal at a junction between said third and fourth resistors.

* * * * *